United States Patent [19]

Laws

[11] Patent Number: 4,853,943
[45] Date of Patent: Aug. 1, 1989

[54] MANCHESTER CODE CLOCK AND DATA RECOVERY SYSTEM

[75] Inventor: Peter G. Laws, Wiltshire, Great Britain

[73] Assignee: Plessey Overseas Limited, Ilford, England

[21] Appl. No.: 156,496

[22] Filed: Feb. 16, 1988

[30] Foreign Application Priority Data

Feb. 26, 1987 [GB] United Kingdom ................ 8704530

[51] Int. Cl.[4] ............................................. H03D 3/04
[52] U.S. Cl. ....................................... 375/87; 375/81; 329/124
[58] Field of Search ................... 375/81, 87, 110, 120; 329/50, 124

[56] References Cited

U.S. PATENT DOCUMENTS 3,626,298 12/1971 Anderson et al. ..................... 375/81
4,130,802 12/1978 Nossen et al. .......................... 375/87

Primary Examiner—Robert L. Griffin
Assistant Examiner—Marianne Huseman
Attorney, Agent, or Firm—Fleit, Jacobson, Cohn, Price, Holman & Stern

[57] ABSTRACT

A Manchester code clock and data recovery system comprises an input means which receives an encoded input signal. Data integration and error integration devices are provided which receive modified versions of the input signal and produce signals for presentation to an error modulator. The modulator generates an error signal for controlling a phase lock loop circuit having a voltage controlled oscillator.

A first output of the oscillator generates signals for controlling the data integration device over a full bit period, and for controlling the error integration device over a half bit period, in a manner that permits the clock signal to be recovered from the first output of the oscillator, and the data to be recovered from the data integration device which is arranged to generate a Manchester biphase coded signal.

6 Claims, 5 Drawing Sheets

MANCHESTER CODE CLOCK AND DATA RECOVERY SYSTEM

BACKGROUND OF THE INVENTION

The present invention relates to a Manchester code clock and data recovery system.

The system is of particular use for clock and data recovery from Manchester Biphase and Biphase Mark Coded Signals.

Manchester codes are similar in that they have one regular transition every bit period and an intermediate transition which may or may not be present dependent on the data. For correct operation, the recovered clock must be phased locked to the regular transitions. A problem with phase lock loop designs can be that incorrect phase lock can be established on an input which contains a large proportion of data dependent transition and once locked will be reluctant to change to the correct phase.

SUMMARY OF THE INVENTION

In the system according to the present invention, the problem is overcome by a novel method of phase error detection. The system becomes unstable when incorrect lock is established followed by random data and hence will establish correct phase lock to a regular input transition.

According to the present invention there is provided a Manchester code clock and data recovery system, comprising input means for receiving an encoded input signal, data integration means and error integration means arranged to produce signals for presentation to an error modulation means arranged to generate an error signal for controlling a phase lock loop circuit including a voltage controlled oscillator having first and second outputs. The first output generates signals for controlling, the data integration means causing it to be sampled over substantially a full bit period, and the error integration means causing it to be sampled over substantially a half-bit period, in a manner that permits a clock signal to be recovered from the first output of the voltage controlled oscillator, and the data to be recovered from the data integration means which is arranged to generate a Manchester biphase coded signal.

According to an aspect of the present invention, there is provided a Manchester code clock and data recovery system wherein a data processing means is arranged to receive the Manchester biphase coded signal and translate the transition polarity of two successive bit periods into true data, and generate a non-return to zero output data signal.

BRIEF DESCRIPTION OF DRAWINGS

An embodiment of the present invention will now be described with reference to the accompanying drawings in which.

DETAILED DESCRIPTION OF THE PREFERRED EMBODIMENT

Figure 1:
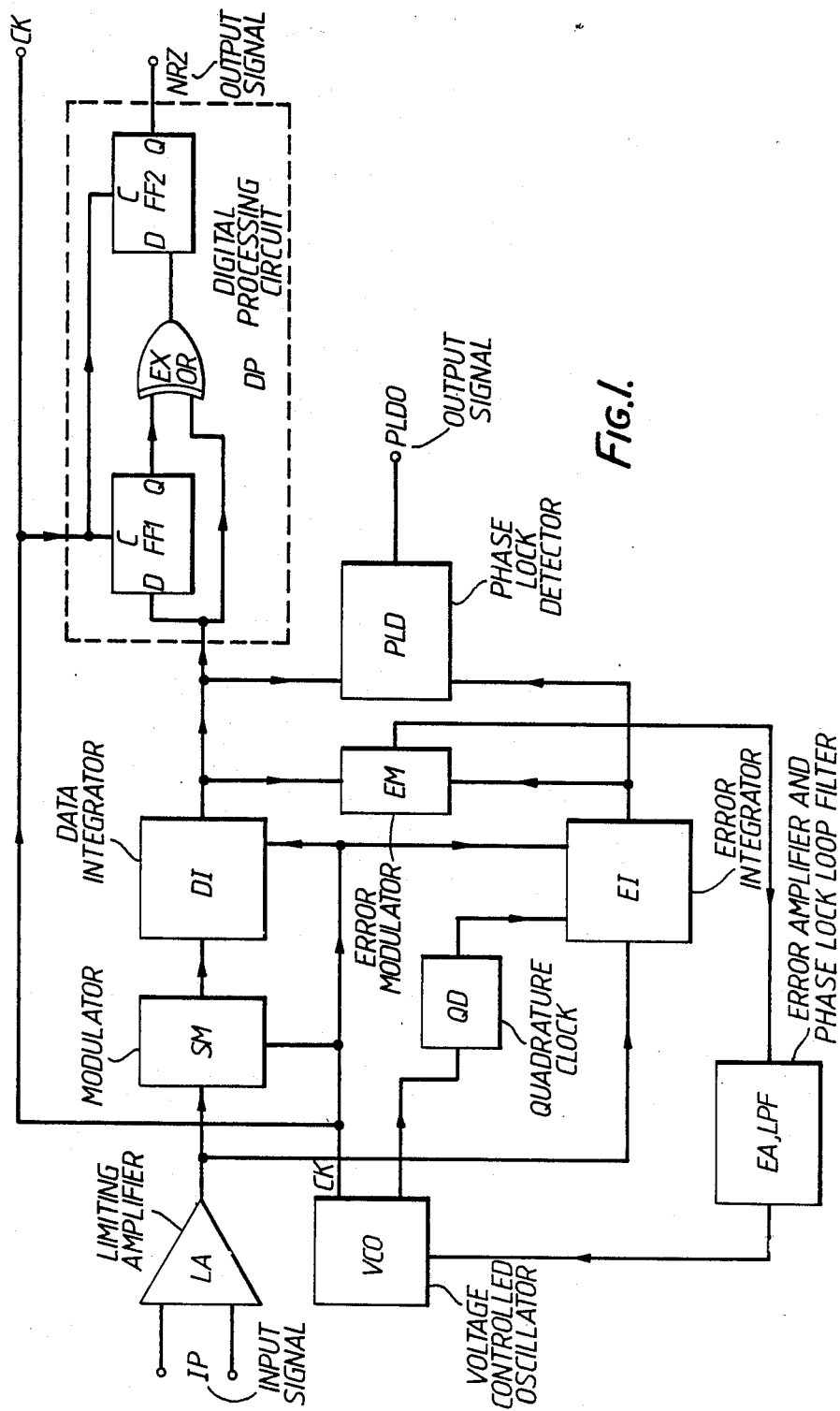
FIG. 1 shows a block diagram of a Manchester code clock and data recovery system according to the present invention.

Referring to FIG. 1, a low level Manchester encoded input signal is amplified by a limiting amplifier LA so that correct signal operating levels are established.

To recover the data information the input signal IP is modulated by the clock signal CK derived from the voltage controlled oscillator VCO. When the circuit is correctly phase locked a transition in the clock waveform will be aligned with the regular transition in the Manchester encoded input signal, hence the output of the modulator SM will be continuously high or low during a clock period depending on whether the input signal transition is positive or negative. Any phase error results in a period of inverted output from the error modulator EM which is filtered out by the data integrator DI. The data integration means DI integrates over a complete bit period such that the output polarity is a best estimate of the transition of the input signal.

When operating with a Manchester biphase signal the output of the data integration means DI can be directly interpreted as data. In the case of biphase mark code operation, a further digital processing circuit DP is required to translate the transition polarity of two successive bit periods into true data. The processing circuit comprises two D-type flip-flops and an exclusive OR gate EX OR, connected as shown in FIG. 1 to produce a non-return to zero data output signal NRZ.

A phase error signal is derived by the error integrator EI, which integrates an input signal over a half bit period which is symmetrical about the centre of the data integration period. This period is provided by a quadrature (90° phase shifted) clock signal, generated by a quadrature clock QD which is controlled by a second output from the voltage controlled oscillator VCO.

When the system is phase locked a transition on the input will occur in the center of this period and the integrated average will be zero. If there is a phase error, however, a net error signal will be derived, the polarity of which will be dependent on the transition polarity of the input signal. A true phase error correction signal is obtained by correcting the polarity by means of the error modulation means EM. The corrected error signal is then used to control the voltage controlled oscillator VCO by way of an error amplifier and normal phase lock loop filter EA, LPF.

An important feature of the error modulator is that there is a linear relationship between the signal from the error integration means EI, and the output, whilst the polarity of the input from the data integration provides switching information. Effectively the gain of the error modulator is higher to the data input.

The function of the integration means DI, EI may be appreciated by reference to U.K. patent application No. 8605002.

Phase lock detection is provided by the phase lock detector PLD which monitors the modulus of the signals derived from the two integration circuits DI and EI. When the system is in lock the data integrator signal will be greater than the error integrator output.

Figure 2:
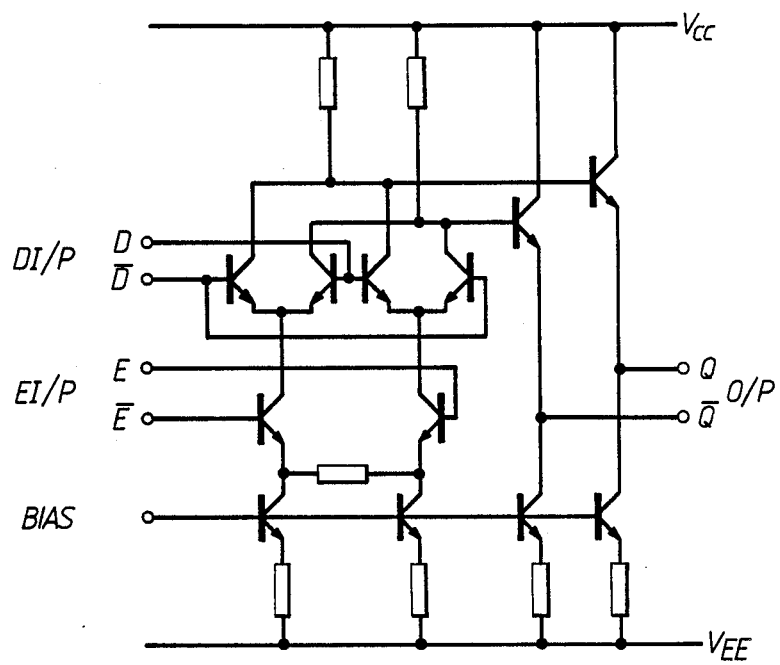
FIG. 2 shows an example of an error modulator.

The function of all other blocks shown in FIG. 1 will readily be appreciated by those skilled in the art and further description is not considered necessary. An example of a known form of error modulator EM is shown in FIG. 2, where the data input D I/P is a positive, negative relationship in accordance with the data integrator DI output. The error input E I/P is an analogue input in accordance with the error integrator EI output.

Figure 3:
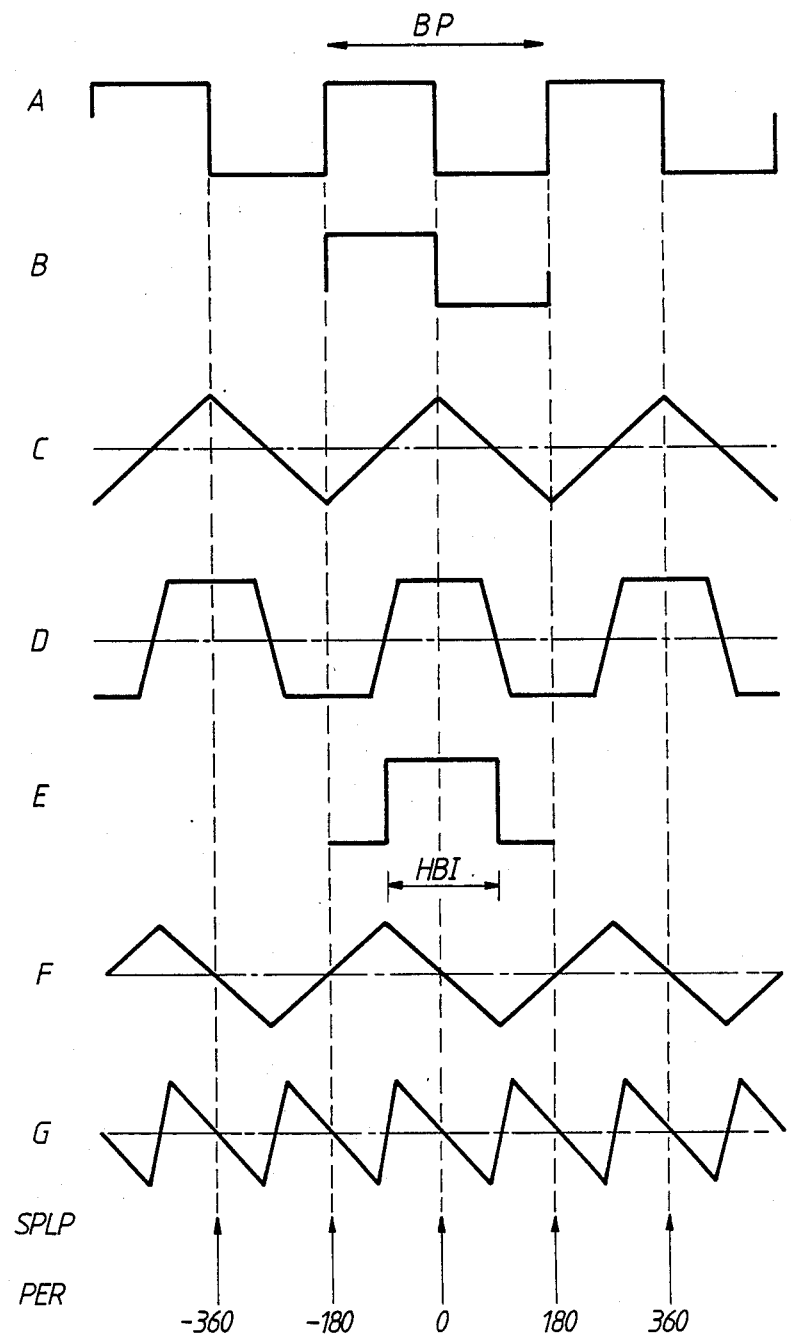
FIG. 3 shows phase error signal functions for maximum transition data input, when data dependent transitions are present.

Referring to FIG. 3, the phase error signal functions are shown. Function A shows a maximum transition data input when data dependant transitions are present. The bit period BP is also shown. Function B shows an in phase clock over a one bit integration period. Function C shows the effect of phase error on the data integrator output. Function D shows the effect of error modulator gain on the data integrator output. Function E shows the quadrature clock and half the bit integration period HBI. Function F shows the effect of phase error on the error integrator error output. Function G shows the resultant error modulator output. The stable phase lock points SPLP are identified by the arrows at the phase error positions PER of 0 to ±180° and ±360°.

Figure 4:
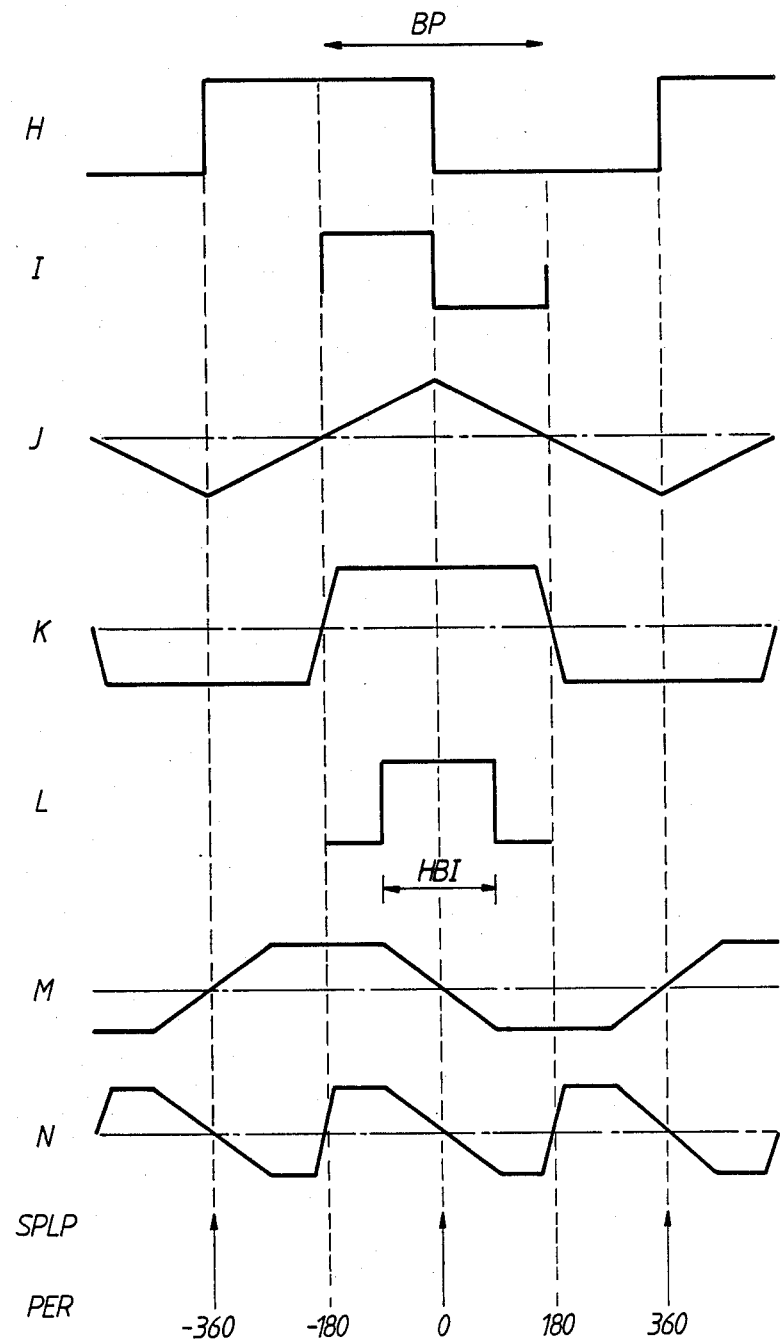
FIG. 4 shows phase error signal functions for minimum transition data input, when clock dependent transitions are only present; and, FIG. 5 shows Manchester encoded waveforms.

Referring to FIG. 4, further phase error functions are shown. Function H shows a maximum transition data input when clock dependant transitions are only present. The bit period BP is again shown. Function I shows the in phase clock over a one bit integration period. Function J shows the effect of phase error on the data integrator output. Function K shows the effect of error modulator gain on the data integrator output. Function L shows the quadrature clock and the half bit integration period HBI. Function M shows the effect of phase error on the error integrator output. Function N shows the resultant error modulator output. The stable phase lock points SPLP are identified by the arrows at phase error position PER of 0 and ±360°.

Figure 5:
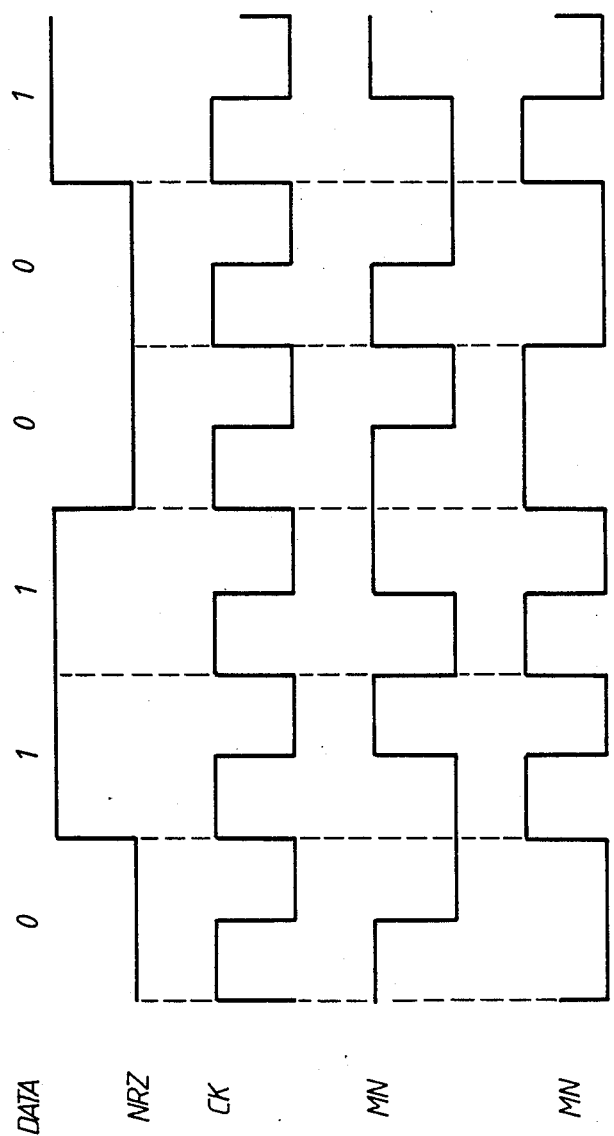

Referring to FIG. 5, Manchester coded waveforms are shown for completeness as follows; waveform MM is a Manchester biphase encoded waveform. Waveform CK is a clock waveform. Waveform NRZ is the non return to zero data waveform. The data is represented as 0's and 1's and from the relationship of the waveforms, when considering waveforms MN 0's correspond to negative transitions, and 1's to positive transitions. When considering waveform MM from which is generated waveform NRZ 0's are represented by the troughs and 1's represented by the peaks.

From the error modulator output functions it can be seen that if the clock waveform is 180° out of phase, phase lock can be established when data dependent transitions occur on the input. When these transitions are removed however, the phase lock loop will become very unstable and hence the clock will be shifted in phase to lock with the regular input signal transitions.

The above description is not intended to limit the scope of the present invention. For example, other forms of circuiting could be used such as integrate and dump type circuits instead of integrate and hold type circuits.

I claim:

1. A Manchester code clock and data recovery system, comprising input means for receiving an encoded input signal having clock and data dependent transitions, a signal modulator connected to the input means, integration means for receiving modulated versions of the input signal from the signal modulator including a data integrator to which the signal modulator is connected and from which a Manchester biphase coded signal is generated and an error integrator connected to the input means, error modulation means connected to the data integrator and the error integrator for producing an error signal, loop circuit means connected to the error modulation means and the integration means for obtaining correct phase lock on the encoded input signal by distinguishing between said clock and data dependent transitions in the encoded input signal under control of the error signal, including a voltage controlled oscillator, first output means operatively connecting the voltage controlled oscillator to the data integrator for sampling over substantially a full bit period, and second output means operatively connecting the voltage controlled oscillator to the error integrator for sampling over substantially a half bit period to enable recovery of a clock signal from the first output means reflecting said clock dependent transitions in the encoded input signal and recovery of data from the Manchester biphase coded signal generated by the data integrator.

2. A Manchester code clock and data recovery system as claimed in claim 1, including data processing means connected to the data integrator for receiving the Manchester biphase coded signal from which transition polarity of two successive bit periods is translated into data, and a non-return to zero output data signal is generated.

3. A Manchester code clock and data recovery system as claimed in claims 1 or 2, including error amplifier and filter means interconnecting the error modulation means with the voltage controlled oscillator for feedback of the error signal in the phase lock loop circuit means.

4. A Manchester code clock and data recovery system as claimed in claim 3, wherein the input means is a limiting amplifier.

5. A Manchester code clock and data recovery system as claimed in claim 4, wherein the second output means includes a quadrature clock circuit through which a clock control signal fed to the error integrator from the voltage controlled oscillator is phase-shifted by substantially 90°.

6. A Manchester code clock and data recovery system as claimed in claim 5, including detector means connected to the data integrator for generating output signals indicative of a phase lock condition.

* * * * *